(12) United States Patent
Heinrich et al.

(10) Patent No.: US 7,905,764 B2
(45) Date of Patent: Mar. 15, 2011

(54) POLISHING HEAD USING ZONE CONTROL

(75) Inventors: Jens Heinrich, Wachau (DE); Gerd Marxsen, Radebeul (DE)

(73) Assignee: GlobolFoundries Inc., Grand Cayman (KY)

( * ) Notice: Subject to any disclaimer, the term of this patent is extended or adjusted under 35 U.S.C. 154(b) by 0 days.

(21) Appl. No.: 12/045,273

(22) Filed: Mar. 10, 2008

(65) Prior Publication Data

US 2009/0061745 A1 Mar. 5, 2009

(30) Foreign Application Priority Data

Aug. 31, 2007 (DE) .......................... 10 2007 041 209

(51) Int. Cl.
*B24B 49/00* (2006.01)

(52) U.S. Cl. ................. 451/7; 451/41; 451/53; 451/287

(58) Field of Classification Search .................. 451/7, 8, 451/41, 53, 54, 63, 285, 287, 288
See application file for complete search history.

(56) References Cited

U.S. PATENT DOCUMENTS

| | | | | |
|---|---|---|---|---|
| 6,150,271 A | * | 11/2000 | Easter et al. | 438/692 |
| 6,749,484 B2 | * | 6/2004 | Yang et al. | 451/7 |
| 7,238,084 B2 | * | 7/2007 | Kim | 451/7 |
| 2003/0114077 A1 | * | 6/2003 | Yang et al. | 451/7 |
| 2003/0186623 A1 | * | 10/2003 | Pham et al. | 451/7 |

FOREIGN PATENT DOCUMENTS

EP 1 852 220 A1 11/2007

OTHER PUBLICATIONS

Translation of Official Communication from German Patent Office for German Patent Application No. 10 2007 041 209.8 dated May 7, 2008.

* cited by examiner

*Primary Examiner* — Eileen P. Morgan
(74) *Attorney, Agent, or Firm* — Williams, Morgan & Amerson, P.C.

(57) ABSTRACT

A polishing head for a chemical mechanical polishing apparatus is provided which includes at least two polishing head zones configured to provide different temperatures for transferring heat to at least two zones of a substrate corresponding to the at least two polishing head zones. The present disclosure addresses chemical mechanical polishing which allows a control of the polishing profile even if slurries are used, which show almost no dependency between polishing rate and down force.

37 Claims, 2 Drawing Sheets e.g.
T2=T1+T*
T3=T2+T*

Removal Rate:
Zone1: R1=f(T1)
Zone2: R2=f(T1+T*)
Zone3: R3=f(T1+2T*)

POLISHING HEAD USING ZONE CONTROL

BACKGROUND OF THE INVENTION

1. Field of the Invention

The present disclosure generally relates to a polishing head, a chemical mechanical polishing apparatus using this polishing head and a method for controlling a polishing profile with the chemical mechanical polishing apparatus, and, in particular, to a polishing head using zone control.

2. Description of the Related Art

In microstructures such as integrated circuits, a large number of elements such as transistors, capacitors and resistors are fabricated on a single substrate by depositing semiconductive, conductive and insulating material layers and patterning these layers by photolithography and etch techniques. Frequently, the problem arises that the patterning of a subsequent material layer is adversely affected by a pronounced topography of the previously formed material layers. Moreover, the fabrication of microstructures often requires the removal of excess material of a previously deposited material layer. For example, individual circuit elements may be electrically connected by means of metal lines that are embedded in a dielectric, thereby forming what is usually referred to as a metallization layer. In modern integrated circuits, a plurality of such metallization layers are typically stacked on top of each other to provide the required functionality. The repeated patterning of material layers, however, creates an increasingly non-planar surface topography, which may deteriorate subsequent patterning processes, especially for microstructures including features with minimum dimensions in the sub-micron range, as is the case for sophisticated integrated circuits.

Further, the demand for higher integration, higher clock frequencies and smaller power consumption in microprocessor technology lead to a new chip interconnection technology using copper instead of aluminum for chip wiring. Since copper is a better conductor than aluminum, chips using this technology may have smaller metal components, and use less energy to pass electricity through them. These effects lead to a high performance of the integrated circuits.

The transition from aluminum to copper required, however, significant developments in fabrication techniques. Since volatile copper compounds do not exist, copper cannot be patterned by photoresist masking and plasma etching, such that a new technology for patterning copper had to be developed, which is known as a copper damascene process. In this process, the underlying insulating layer is patterned with open trenches where the conductor should be filled in. A thick coating of copper that significantly overfills the trenches is deposited on the insulating layer. The excess copper is then removed down to the top level of the trench. Currently, there is no effective copper dry etching method because of problems removing low volatility copper compounds. Presently, chemical mechanical polishing (CMP) is used for removing the excess copper.

The repeated patterning of material layers, however, creates a non-planar surface topography, which may deteriorate subsequent patterning processes, especially for microstructures including features with minimum dimensions in the sub-micron range, as is the case for sophisticated integrated circuits.

In conclusion, it is typically necessary to planarize the surface of the substrate between the formation of subsequent layers. A planar surface of the substrate is desirable for various reasons, one of them being the limited optical depth of the focus in photolithography which is used to pattern the material layers of microstructures.

Chemical mechanical polishing (CMP) is an appropriate and widely used process to remove excess material, including copper and tungsten, and to achieve global planarization of a substrate. In the CMP process, a wafer is mounted on an appropriately formed carrier, a so-called polishing head, and the carrier is moved relative to a polishing pad while the wafer is in contact with the polishing pad. A slurry is supplied to the polishing pad during the CMP process and contains a chemical compound reacting with the material or materials of the layer to be planarized by, for example, converting the material into an oxide, while the reaction product, such as the metal oxide, is then mechanically removed with abrasives contained in the slurry and/or the polishing pad. To obtain a required removal rate, while at the same time achieving a high degree of planarity of the layer, parameters and conditions of the CMP process must be appropriately chosen, thereby considering factors such as construction of the polishing pad, type of slurry, pressure applied to the wafer while moving relative to the polishing pad and the relative velocity between the wafer and the polishing pad. The removal rate further significantly depends on the temperature of the slurry, which in turn is significantly affected by the amount of friction created by the relative motion of the polishing pad and the wafer, the degree of saturation of the slurry with ablated particles and, in particular, the state of the polishing surface of the polishing pad.

FIG. 1 schematically shows a sketch of a conventional system 100 for chemical mechanical polishing. The system 100 comprises a platen 101 on which a polishing pad 102 is mounted. Frequently, polishing pads are formed of a cellular microstructure polymer material having numerous voids, such as polyurethane. A polishing head 130 comprises a body 104 and a substrate holder 105 for receiving and holding a substrate 103. The polishing head 130 is coupled to a drive assembly 106. The device 100 further comprises a slurry supply 112 and a pad conditioner (not shown).

In operation, the platen 101 rotates. The slurry supply 112 supplies slurry to a surface of the polishing pad 102 where it is dispensed by centrifugal forces. The slurry comprises a chemical compound reacting with the material or materials on the surface of the substrate 103. The reaction product is removed by abrasives contained in the slurry and/or the polishing pad 102. The polishing head 130, and thus also the substrate 103, is rotated by the drive assembly 106 in order to substantially compensate for the effects of different linear velocities of parts of the polishing pad 102 at different radii. In advanced systems 100, the rotating polishing head 130 is additionally moved across the polishing pad 102 to further optimize the relative motion between the substrate 103 and the polishing pad 102 and to maximize pad utilization. The pad conditioner may comprise an abrasive component, e.g., diamonds, embedded in a matrix. Thus, the surface of the polishing pad 102 is abraded and densified slurry, as well as particles that have been polished away from the surface of the substrate, are removed from voids in the porous polishing pad 102.

Various designs of chemical mechanical polishing devices are known in the art. For example, the rotating platen 101 may be replaced with a continuous belt kept in tension by rollers moving at high speed, or slurry may be injected through the polishing pad 102 in order to deliver slurry directly to the interface between the polishing pad 102 and the substrate 103.

State of the art CMP processes use polishing heads that are capable of adjusting the polishing removal rate to flatten the removal profile by applying zone dedicated back pressures to the wafers. This means that the polishing head can provide a non-homogeneous pressure distribution which allows control of the polishing profile such that the polishing profile may be adjusted to be inverse to a deposition profile of a preceding deposition process, e.g., with an electrochemical plating tool for copper deposition.

In metal polishing processes, specifically in a copper CMP and a tungsten CMP, newly developed polishing slurries tend to have less mechanical properties and instead more chemical polishing properties. That means that the polishing rate does not (strongly) follow Preston's equation (developed by Preston, 1927) which models the mechanical effects of pressure and velocity in the CMP process:

$$R = K \cdot P \cdot V$$

where R denotes the polish rate, P is the applied downward pressure, V is the linear velocity of the wafer relative to the polishing pad and K is a proportionality constant, called the Preston coefficient.

These slurries are specifically designed for very low down force processes that are typically employed with ULK materials (ultra low dielectric constant materials). Some of these slurries do not show any significant increase of the removal rate when the downward pressure is increased. As a result, the control of the removal profile is limited with conventional polishing heads using zone dedicated back pressures.

Therefore, one problem with conventional systems for chemical mechanical polishing is that control of the polishing profile is not sufficiently effective for CMP processes, in particular if ULK materials are involved.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one embodiment of this disclosure, a polishing head for a chemical mechanical polishing apparatus comprises at least two polishing head zones configured to provide different temperatures for transferring heat to at least two zones of a substrate corresponding to the at least two polishing head zones.

According to another embodiment of this disclosure, a chemical mechanical polishing apparatus comprises a polishing platen rotatably supported and driven by a drive assembly, a polishing pad attached to the polishing platen, a slurry supply arranged to allow the supply of polishing slurry to the polishing pad and a polishing head supported rotatably and radially movable relative to the polishing platen, wherein the polishing head comprises at least two polishing head zones configured to provide different temperatures for transferring heat to at least two zones of a substrate corresponding to the at least two polishing head zones, wherein the zones are formed by at least one of (i) separated chambers in the polishing head, each provided with a fluid inlet and a fluid outlet for supplying the separated chambers with a first type of fluid having a predetermined temperature, and (ii) separated electrical heating zones.

According to a further embodiment of this disclosure, there is provided a method for controlling an across wafer removal profile with a chemical mechanical polishing apparatus including a polish head with at least two polishing head zones configured to provide different temperatures for transferring heat to at least two zones of a substrate corresponding to the at least two polishing head zones, wherein the method comprises the steps of supplying a chemically active polishing slurry to a rotating polishing pad, placing the polishing head eccentrically above the polishing pad with a substrate to be polished therebetween, setting each temperature controllable zone to a predetermined temperature and rotating the polishing head, thereby removing excess material from the substrate.

BRIEF DESCRIPTION OF THE DRAWINGS

The disclosure may be understood by reference to the following description taken in conjunction with the accompanying drawings, in which like reference numerals identify like elements, and in which.

Figure 1:
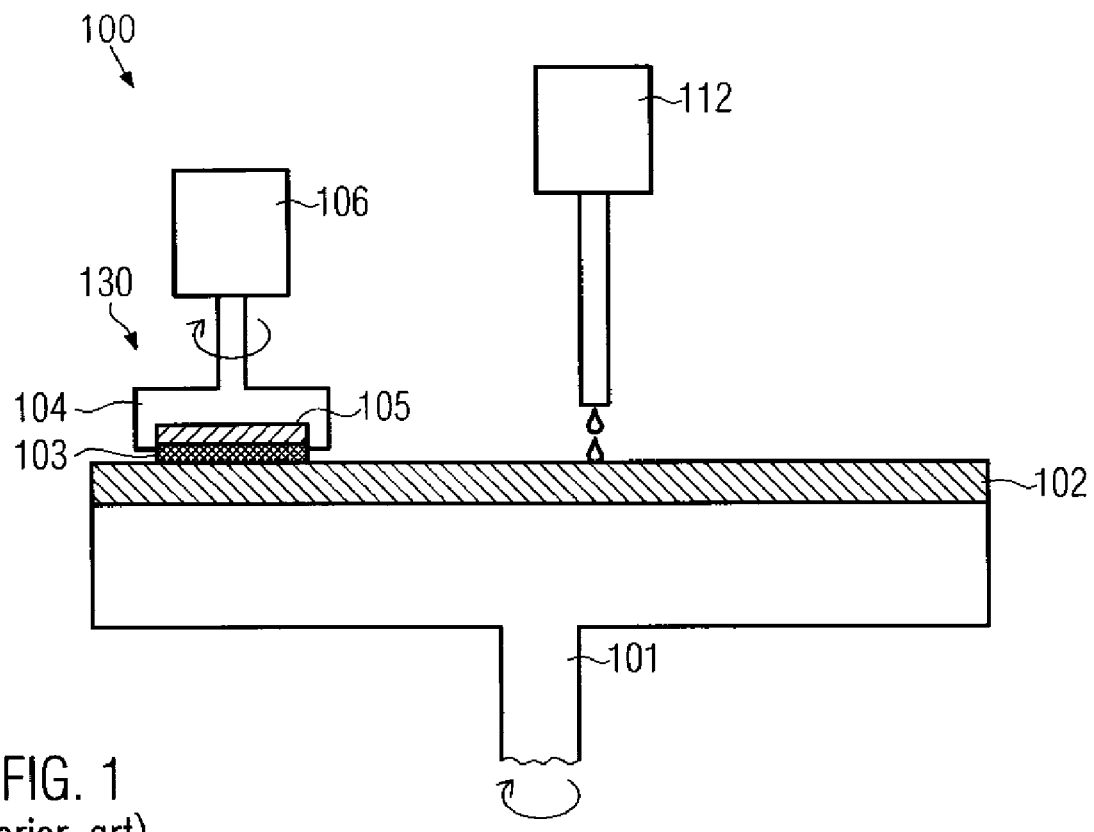
FIG. 1 shows a sketch of a simplified conventional system for chemical mechanical polishing.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally directed to chemical mechanical polishing which allows control of the polishing profile, even if slurries are used, which show almost no dependency between polishing rate and down force. Further, this disclosure addresses chemical mechanical polishing in very low down force processes that are necessary if ULK materials are involved, which are very sensitive to stress. Since conventional chemical mechanical polishing processes work with polishing heads with zone dedicated back pressures for controlling the polishing profile, the state of the art polishing apparatus are not suitable for low down force polishing processes.

Besides the method using zone dedicated back pressure adjustment for polishing profile control, other process parameters exist, such as slurry flow, platen speed and head speed, which have an influence on the polishing rate. These influences are, however, more complex and are difficult to apply in real time process control resulting in more profile deviations and process risk.

Therefore, the present disclosure provides a polishing head which is segmented into at least two different segments or zones which allow individual temperature adjustment. Since the polishing effect of the low down force slurries is based on chemical reactions, the temperature dependence of the chemical reaction may be used for polishing rate control. Typically, the relation between temperature and polishing rate is an Arrhenius type dependency, as illustrated in the calibration curve in FIG. 5. Thus, a control of polish profile may be realized.

Figure 2:
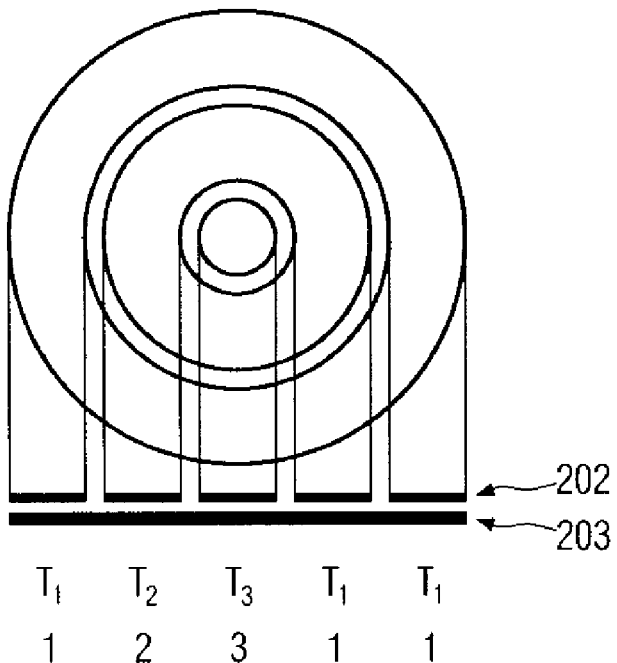
FIG. 2 schematically shows the separation of the polishing head into circular zones with different temperatures, according to the present disclosure.

FIG. 2 schematically depicts a zone structure 202 of a polishing head 130. The different temperatures T1, T2 and T3 are transferred to a substrate 203, one side of which is in close contact with the Zones 1, 2 and 3 of the polishing head. During operation, the other side of the substrate 203 is exposed to the chemical polishing slurry to remove excess material thereon during the polishing process.

As illustrated in FIG. 2, in one illustrative embodiment, the zones typically have a circular shape. The zones are, however, not limited to a circular shape or a particular number. As the person skilled in the art will appreciate after a complete reading of the present application, the shape and the number of the zones may be designed according to the needs of a particular process. For example, the zones may have a semi-circular or rectangular shape and may comprise more than or less than four segments, depending on the desired temperature gradient and smoothness of the gradient. FIG. 2 further presents an illustrative example for particular temperatures in the zones. In detail, Zone 1 is adjusted to temperature T1. Zone 2 is adjusted to a temperature that is higher than T1 by T*. Zone 3, that represents the zone in the center, is adjusted to a temperature that is higher than the temperature T2 by the same temperature T* as before. This leads to a rotationally symmetric temperature distribution that is approximately bell-shaped. As a result, the removal rate during polishing has its maximum in the center of the substrate 203, and decreases constantly to the edge of the substrate 203. Thus, a polishing profile may be achieved which is inverse to a deposition profile of, for instance, an electrochemical plating tool for depositing copper.

There are several approaches to providing a polishing head with zones of different temperatures. In the first approach, the polishing head is provided with separate chambers, whereby each chamber is associated with a particular zone. The temperature in each zone is adjusted by filling the chamber with a fluid of a particular temperature. This approach allows heating above ambient temperature and cooling below ambient temperature according to the process needs.

According to a second approach, the zones are provided by attaching separated electrical heating elements to the polishing head, which are brought into contact with the substrate. The second approach allows only actively heating above ambient temperature. Cooling is restricted to naturally cooling down to ambient temperatures. Further active cooling requires additional means for active cooling below ambient by, for instance, Peltier elements or supplying pre-cooled gases or liquids.

In order to enhance the capability of temperature adjustment in terms of velocity of temperature changes and extending the achievable temperature range, both approaches may be combined.

In order to improve efficiency of temperature adjustment, the polishing head may further comprise a heat transfer element for transferring heat from the polishing head zones to the corresponding substrate zones. The heat transfer element should have high thermal conductivity and a low thermal capacitance. This may be achieved by selecting appropriate materials and reducing thickness and volume of the heat transfer element.

In order to achieve a better control of the temperature distribution, the heat transfer element may be formed in segments corresponding to the polishing head zones.

Improving heating and cooling efficiency may be achieved if the heat transfer element is provided with a cavity having a predetermined volume containing a fluid for heat transfer. Optionally the fluid may be exchanged and the cavity may be designed in a flow through configuration in order to further improve efficiency of temperature adjustments.

The heat transfer element may comprise a thin sheet-like membrane with high thermal conductivity, for instance made of a metal, for separating fluid from the substrate. The volume of the cavity has a thickness of less than 5 mm and preferably of less than 2 mm. The sheet-like membrane has a preferable thickness of less than 1 mm. The fluid may comprise a noble gas, for example, argon gas.

In order to improve cooling efficiency, the separated electrical heating zones may further comprise means for removing heat, for instance a Peltier element or heat sink with a fluid as means for removal of heat.

Figure 3:
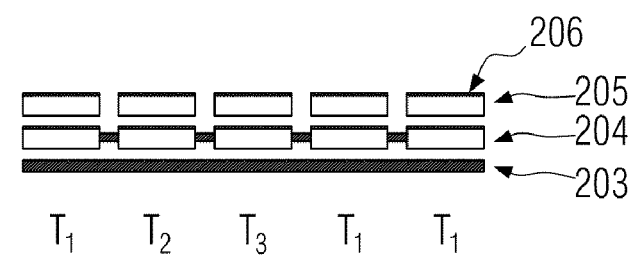
FIG. 3 illustrates an embodiment for realizing a polishing head with zones of different temperatures.
Figure 4:
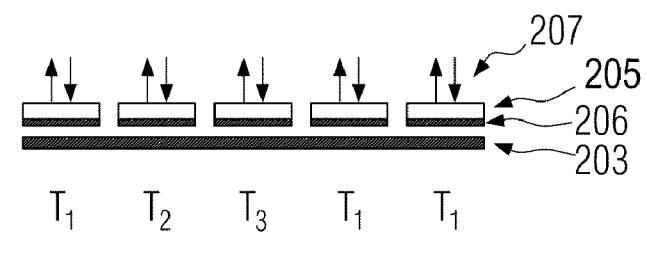
FIG. 4 exemplifies another embodiment for realizing a polishing head with zones of different temperatures.

FIGS. 3 and 4 exemplify two embodiments of a realization of zones for adjusting temperature.

In FIG. 3, zones are provided by attaching separated electrical heating zones using a contact material to the wafer having a high thermal conductivity and a low thermal capacitance. In FIG. 3, reference numeral 206 denotes an electrical heater which is attached to a small volume of a heat transfer medium 205. The predetermined volume of heat transfer medium 205 is separated from the substrate 203 by a sheet-like membrane 204. In the case of the embodiment illustrated in FIG. 3, the sheet-like membrane 204 is separated into zone-like parts corresponding to the zones of different temperatures. In order to improve heat transfer, the volume of the heat transfer medium should have a thickness of less than 5 mm and preferably less than 2 mm. The heat transfer medium should have a high thermal conductivity and a small thermal capacitance. Preferably, noble gases, e.g., argon, as a heat transfer medium is preferred. For cooling down the zones, the native cool down may be used, pre-cooled gas or liquid may replace the working material of the heat transfer medium 205, or Peltier elements may be used.

FIG. 4 shows an embodiment wherein one side of heating elements 206 are brought into contact with one side of a substrate 203. The other side of the heating elements 206 is in contact with a heat transfer medium 205 to improve efficiency of cooling and heating. In order to enhance the capability of temperature adjustment beyond the natural heating and cooling capability of the heating element, the fluid or the gas may be changed, for instance, by use of a flow-through configuration 207.

Figure 5:
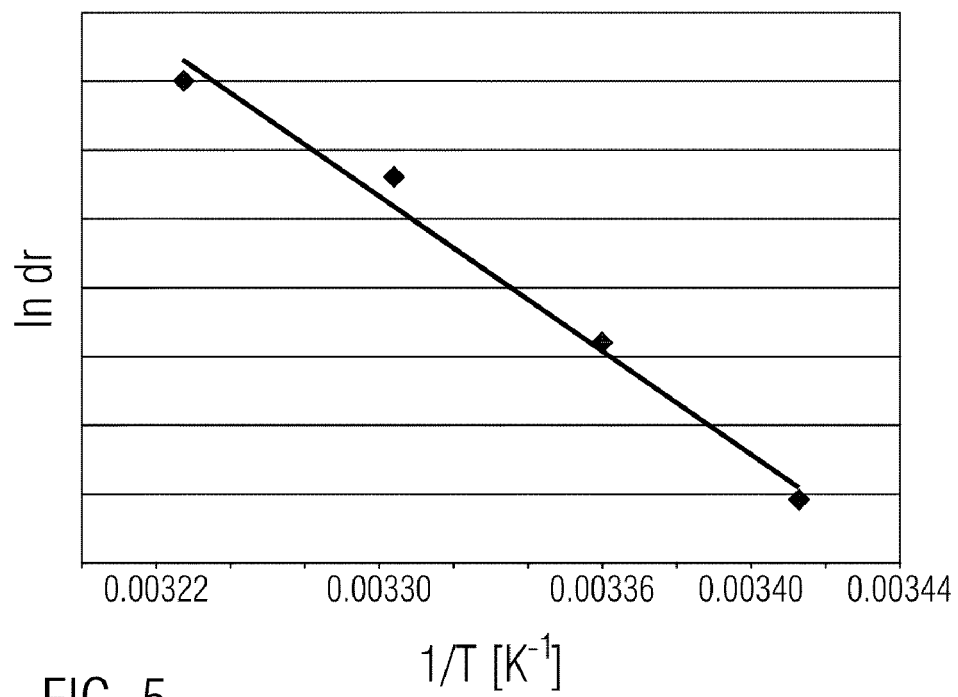
FIG. 5 illustrates a calibration curve for the temperature dependency of a polishing rate.

A method of chemical mechanical polishing is explained in the following. At first, a chemically active polishing slurry is supplied to a rotating polishing pad. Next, the polishing head is placed eccentrically above the polishing pad with a substrate to be polished being placed therebetween. Then, each temperature controllable zone is set to a predetermined temperature. Finally, the polishing head is rotated, thereby removing excess material from the substrate. In one illustrative embodiment, the temperature of each zone is set on the basis of a known profile of a material deposited on the substrate and a known relation between temperature and polishing rate. This relation is determined in a calibration process and leads to a calibration curve as exemplified in FIG. 5. Typically, the measurement data are inserted in an Arrhenius plot, which leads to a linearized calibration curve, thus simplifying the interpolation of calibration data. In FIG. 5, the horizontal axis denotes the inverse absolute temperature in a Kelvin scale and the vertical axis denotes the natural logarithm of the removal rate in an Angstrom per second scale. FIG. 5 is used only for illustrative purposes and values for the vertical axis have been omitted because they depend strongly on the used slurry. The horizontal axis shows the conventional working temperature range.

In order to accelerate heat flow and temperature adjustment, the heat transfer medium may be replaced by a predetermined rate that is smaller than a heat transfer rate from the heat transfer fluid to the substrate. In one illustrative embodiment, the temperatures are set such that the expected removal profile (polishing profile) is inverse to the deposition profile to achieve a flat surface after polishing. The temperature adjustment may be carried out on the basis of a run-by-run temperature adjustment or on the basis of an on-the-fly adjustment. The proposed method and devices are not limited to conventional chemical mechanical polishing, but also include electrochemical mechanical polishing, whereby the polishing rate is fine tuned by temperature adjustments due to temperature dependence of a Redox potential.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A polishing head for a chemical mechanical polishing apparatus, comprising:
   a polishing head body, said polishing head body comprising at least two polishing head zones, wherein each of said at least two polishing head zones comprises separated chambers in said polishing head, each of said polishing head zones adapted to be at different temperatures for transferring heat to at least two corresponding zones of a substrate, and further comprising a fluid inlet and a fluid outlet for each of said separated chambers, wherein a first type of fluid supplied to each of said separated chambers of each of said at least two polishing head zones has a different predetermined temperature; and
   a heat transfer element comprising a second type of fluid, said heat transfer element adapted for transferring heat from each of said at least two polishing head zones of said polishing head body to each of said at least two corresponding substrate zones.

2. The polishing head according to claim 1, wherein each of said at least two polishing head zones have circular shape.

3. The polishing head according to claim 1, wherein each of said at least two polishing head zones are configured for at least one of heating and cooling.

4. The polishing head according to claim 1, wherein each of said at least two polishing head zones further comprise separated electrical heating zones.

5. The polishing head according to claim 1, wherein said heat transfer element is formed in segments corresponding to each of said at least two polishing head zones.

6. The polishing head according to claim 1, wherein said heat transfer element comprises a cavity having a predetermined volume, said cavity containing said second type of fluid for heat transfer.

7. The polishing head according to claim 6, wherein said heat transfer element comprises a sheet-like membrane for separating at least one of said first and second type of fluid from said substrate.

8. The polishing head according to claim 7, wherein said second type of fluid has a high thermal conductivity and a low thermal capacitance.

9. The polishing head according to claim 6, wherein said cavity having said predetermined volume has a thickness of less than 5 mm.

10. The polishing head according to claim 6, wherein said cavity having said predetermined volume has a thickness of less than 2 mm.

11. The polishing head according to claim 7, wherein said sheet-like membrane has a thickness of less than 1 mm.

12. The polishing head according to claim 7, wherein said second type of fluid comprises a noble gas.

13. The polishing head according to claim 12, wherein said noble gas is argon.

14. The polishing head according to claim 4, wherein said first type of fluid comprises a liquid.

15. The polishing head according to claim 4, wherein said separated electrical heating zones further comprise a means for removing heat.

16. The polishing head according to claim 15, wherein said means for removing heat comprises at least one of a Peltier element and a fluid heat sink.

17. A chemical mechanical polishing apparatus, comprising:
   a polishing platen rotatably supported and driven by a drive assembly;
   a polishing pad attached to said polishing platen;

a slurry supply arranged to allow the supply of polishing slurry to said polishing pad; and a polishing head supported rotatably and radially movable relative to said polishing platen, said polishing head comprising:

a polishing head body, said polishing head body comprising at least two polishing head zones, wherein each of said at least two polishing head zones comprises separated chambers in said polishing head, each of said polishing head zones adapted to be at different temperatures for transferring heat to at least two corresponding zones of a substrate, and further comprising a fluid inlet and a fluid outlet for each of said separated chambers, wherein a first type of fluid supplied to each of said separated chambers of each of said at least two polishing head zones has a different predetermined temperature; and a heat transfer element comprising a second type of fluid, said heat transfer element adapted for transferring heat from each of said at least two polishing head zones of said polishing head body to each of said at least two corresponding substrate zones.

18. The chemical mechanical polishing apparatus according to claim 17, wherein said heat transfer element comprises a cavity having a predetermined volume containing said second type of fluid for heat transfer, and a sheet-like membrane for separating at least one of said first and second type of fluid from said substrate.

19. The chemical mechanical polishing apparatus according to claim 17, further comprising separated electrical heating zones.

20. The chemical mechanical polishing apparatus according to claim 19, wherein said separated electrical heating zones further comprise a means for removing heat, said means for removing heat comprising at least one of a Peltier element and a fluid heat sink.

21. A method for controlling an across-wafer removal profile of a substrate with a chemical mechanical polishing apparatus, said chemical mechanical polishing apparatus comprising polishing head body having at least two temperature controllable polishing head zones, each of said at least two temperature controllable polishing head zones corresponding to at least two zones of said substrate and adapted to be at different temperatures for transferring heat to each of said at least two corresponding substrate zones, said method comprising:

supplying a chemically active polishing slurry to a rotating polishing pad;

placing said polishing head eccentrically above said polishing pad with said substrate to be polished therebetween;

setting each of said at least two temperature controllable polishing head zones to a predetermined temperature, wherein setting said predetermined temperature comprises replacing a first heat transfer medium at a predetermined rate that is smaller than a heat transfer rate from said substrate and transferring heat from said heat transfer medium to said at least two zones of said substrate using a heat transfer element comprising a second heat transfer medium; and rotating said polishing head, thereby removing excess material from said substrate.

22. The method of claim 21, wherein said predetermined temperature of each of said at least two temperature controllable polishing head zones is set on the basis of a known profile of a material deposited on a substrate and a known relation between temperature and polishing rate.

23. The method of claim 21, wherein said across-wafer removal profile of said substrate is controlled on the basis of one of a run-by-run temperature adjustment and an on the fly adjustment.

24. The method of claim 21, wherein said chemical mechanical polishing includes electrochemical mechanical polishing.

25. The method of claim 21, wherein said predetermined temperature is different for each of said at least two temperature controllable polishing head zones.

26. A polishing head for a chemical mechanical polishing apparatus, comprising:

a polishing head body, said polishing head body comprising at least two polishing head zones, each of said at least two polishing head zones corresponding to at least two zones of a substrate corresponding to the at least two polishing head zones, wherein each of said at least two polishing head zones is formed of separated electrical heating zones and adapted to be at different temperatures for transferring heat to each of said at least two corresponding substrate zones; and a heat transfer element comprising a fluid for heat transfer, said heat transfer element adapted for transferring heat from each of said at least two polishing head zones to each of said at least two corresponding substrate zones.

27. The polishing head according to claim 26, wherein said heat transfer element is formed in segments corresponding to each of said at least two polishing head zones.

28. The polishing head according to claim 26, wherein said heat transfer element comprises a cavity having a predetermined volume, said cavity containing said fluid for heat transfer.

29. The polishing head according to claim 28, wherein said heat transfer element comprises a sheet-like membrane for separating said fluid from said substrate.

30. The polishing head according to claim 28, wherein said cavity having said predetermined volume has a thickness of less than 5 mm.

31. The polishing head according to claim 28, wherein said cavity having said predetermined volume has a thickness of less than 2 mm.

32. The polishing head according to claim 29, wherein said sheet-like membrane has a thickness of less than 1 mm.

33. The polishing head according to claim 29, wherein said fluid has a high thermal conductivity and a low thermal capacitance.

34. The polishing head according to claim 29, wherein said fluid comprises a noble gas.

35. The polishing head according to claim 34, wherein said noble gas is argon.

36. The polishing head according to claim 26, wherein said separated electrical heating zones further comprise a means for removing heat.

37. The polishing head according to claim 36, wherein said means for removing heat comprises at least one of a Peltier element and a fluid heat sink.

* * * * *